US008786292B2

(12) United States Patent
Parsons

(10) Patent No.: US 8,786,292 B2
(45) Date of Patent: Jul. 22, 2014

(54) POWER CONDUCTOR MONITORING DEVICE AND METHOD OF CALIBRATION

(75) Inventor: Mark A. Parsons, Colorado Springs, CO (US)

(73) Assignee: Sentient Energy, Inc., Burlingame, CA (US)

( * ) Notice: Subject to any disclaimer, the term of this patent is extended or adjusted under 35 U.S.C. 154(b) by 303 days.

(21) Appl. No.: 13/312,714

(22) Filed: Dec. 6, 2011

(65) Prior Publication Data
US 2012/0139554 A1 Jun. 7, 2012

Related U.S. Application Data

(60) Provisional application No. 61/420,247, filed on Dec. 6, 2010.

(51) Int. Cl.
G01R 31/02 (2006.01)
(52) U.S. Cl.
USPC ............ 324/543; 324/127; 324/149; 324/535
(58) Field of Classification Search
None
See application file for complete search history.

(56) References Cited

U.S. PATENT DOCUMENTS 4,799,005 A * 1/1989 Fernandes ..................... 324/127
6,927,672 B2 * 8/2005 Zalitzky et al. ............ 340/12.38

* cited by examiner

Primary Examiner — Minh N Tang
(74) Attorney, Agent, or Firm — Shay Glenn LLP

(57) ABSTRACT

A power distribution monitoring system is provided that can include a number of features. The system can include a plurality of monitoring devices configured to attach to individual conductors on a power grid distribution network. In some embodiments, a monitoring device is disposed on each conductor of a three-phase network. The monitoring devices can be configured to measure and monitor, among other things, current and electric-field on the conductors. Methods of calibrating the monitoring devices to accurately measure electric-field are also provided. In one embodiment, a first monitoring device on a first conductor can transmit a calibration pulse to a second monitoring device on a second conductor. The second monitoring device can determine a degradation of the calibration pulse, and use that degradation to calibrate electric-field measurements around the conductor.

20 Claims, 4 Drawing Sheets

POWER CONDUCTOR MONITORING DEVICE AND METHOD OF CALIBRATION

CROSS REFERENCE TO RELATED APPLICATIONS

This application claims the benefit under 35 U.S.C. 119 of U.S. Provisional Patent Application No. 61/420,247, filed Dec. 6, 2010, titled "Power Line Monitoring Device and Method of Calibration", which application is incorporated by reference as if fully set forth herein.

INCORPORATION BY REFERENCE

All publications and patent applications mentioned in this specification are herein incorporated by reference to the same extent as if each individual publication or patent application was specifically and individually indicated to be incorporated by reference.

FIELD OF THE INVENTION

The present invention generally relates to power distribution networks. More specifically, the present invention relates to monitoring of power distribution systems.

BACKGROUND OF THE INVENTION

In providing power to customers, electrical power utility companies employ a power grid distribution network that includes distribution-line-conductors (which are often referred to as power lines). Typically, difficulties or faults within the distribution network are identified only after occurrences of "events." These events may merely result in a temporary loss of power for a limited number of customers, but more significant problems may occur.

Protection components and systems are known. "Reactive" components are particularly common. A reactive component is a device or system that is activated or deactivated by a fault event or its consequences. For example, a circuit breaker will open a transmission line as a response to excessive current, thereby protecting power distribution equipment. More sophisticated systems are also available.

Clearly, there are benefits to identifying conditions that precede fault events. For example, if it can be determined that a power line from a power transformer is experiencing intermittent fluctuations, scheduling a replacement of the transformer to avoid an outage event would be beneficial to the utility provider and its customers. Thus, "predictive" components and systems are desirable. Monitoring systems that monitor power parameters of equipment and power lines can provide useful information for the prevention and identification of power distribution faults or events.

Power factor is the ratio of real power to apparent power, and ranges from a value of 0 to 1. This is important to utility companies because power factors less than 1 indicate losses and inefficiencies in the distribution network, costing the utility companies money. Measurement of the power factor on the power lines requires accurate measurement of both the changing current signal and changing voltage signal. Conventional monitoring systems tap into power distribution systems to monitor alternating voltage with direct galvanic connections. Galvanic voltage measurement requires connections to two potentials, one being the voltage to be measured, the other being the voltage with respect to which to the measurement is measured (for example a conductor or contact at ground potential). This typically requires a non-isolated galvanic connection or a capacitive connection with special care given to isolate the voltages present. The non-isolated electrical connection and associated equipment is expensive and expensive to install. Further it does not provide for an easily deployed solution in a wide range of locations along a distribution network. Other specialized monitoring systems are known that mount on the distribution lines without a ground reference for voltage measurement. However, these specialized monitoring systems have been unable to accurately measure changing voltage at the power lines from the surrounding electric field due to changes in weather, traffic, dirt buildup on the lines, construction of or placement of large objects near the power lines, etc. Thus, utility companies must rely on measurement of power factor at electrical substations or remote expensive monitoring equipment, which does not facilitate identification of the specific location along a distribution system responsible for a reduced power factor.

SUMMARY OF THE DISCLOSURE

In one embodiment, a method of monitoring a power grid distribution network is provided, comprising transmitting a calibration pulse with a first monitoring device on a first power conductor, receiving the calibration pulse with a second monitoring device on a second power conductor, determining a degradation of the calibration pulse from the first monitoring device to the second monitoring device, and calibrating the second monitoring device to account for a difference between a measured electric-field of the second power conductor and an actual electric-field of the second power conductor based on the degradation of the calibration pulse.

In some embodiments, the method further comprises receiving the calibration with a third monitoring device on a third power conductor. In one embodiment, the first, second, and third monitoring devices are disposed on power conductors corresponding to each phase of a three-phase network.

In some embodiments, the calibration pulse comprises a time varying electromagnetic pulse. In another embodiment, the electromagnetic pulse comprises properties different than the electric field properties surrounding the power grid distribution network. In other embodiments, the electromagnetic pulse comprises a time varying frequency between the primary and harmonics frequencies of the power grid distribution network.

In one embodiment the method further comprises, prior to the transmitting a calibration pulse step, transmitting a timing pulse from the first monitoring device to the second monitoring device to coordinate a calibration of the devices. In some embodiments, the second monitoring device enters a calibration mode after receiving the timing pulse. In other embodiments, the second monitoring device enters a calibration mode a pre-determined period of time after receiving the timing pulse.

In some embodiments, the determining a degradation step comprises applying digital signal processing techniques to the received calibration pulse.

In other embodiments, the degradation comprises a sensed difference in the calibration pulse transmitted by the first monitoring device and received by the second monitoring device.

A power distribution network monitoring system is also provided, comprising a first monitoring device disposed on a first power conductor and comprising sensors configured to measure an electric-field of the first power conductor, the first monitoring device including a transmitter configured to transmit a calibration pulse, a second monitoring device disposed on a second power conductor in the vicinity of the first monitoring device and comprising sensors configured to measure an electric-field of the second power conductor, the second monitoring device including a receiver configured to receive the calibration pulse from the first monitoring device, and a processor disposed in the second monitoring device, the processor configured to determine a degradation of the calibration pulse after it has been received by the second monitoring device, the processor further configured to calibrate a measured electric-field surrounding the second power conductor based on the degradation of the calibration pulse.

In some embodiments, the power distribution network monitoring system further comprises a third monitoring device disposed on a third power conductor in the vicinity of the first and second monitoring devices and configured to measure an electric-field of the third power conductor, the third monitoring device including a receiver configured to receive the calibration pulse from the first monitoring device.

In some embodiments, the first and second power conductors comprise a single-phase power network.

In other embodiments, the first, second, and third power conductors comprise a three-phase power network.

In one embodiment, the first and second monitoring devices are configured to harvest energy from the power conductors for operation.

In other embodiments, the first and second monitoring devices are configured to monitor the power conductors for events or faults.

In some embodiments, the calibration pulse comprises a time varying electromagnetic pulse. In one embodiment, the electromagnetic pulse comprises properties different than the electric field properties surrounding the power grid distribution network. In other embodiments, the electromagnetic pulse comprises a time varying frequency between the primary and harmonics frequencies of the power grid distribution network.

DETAILED DESCRIPTION OF THE INVENTION

Figure 1A:
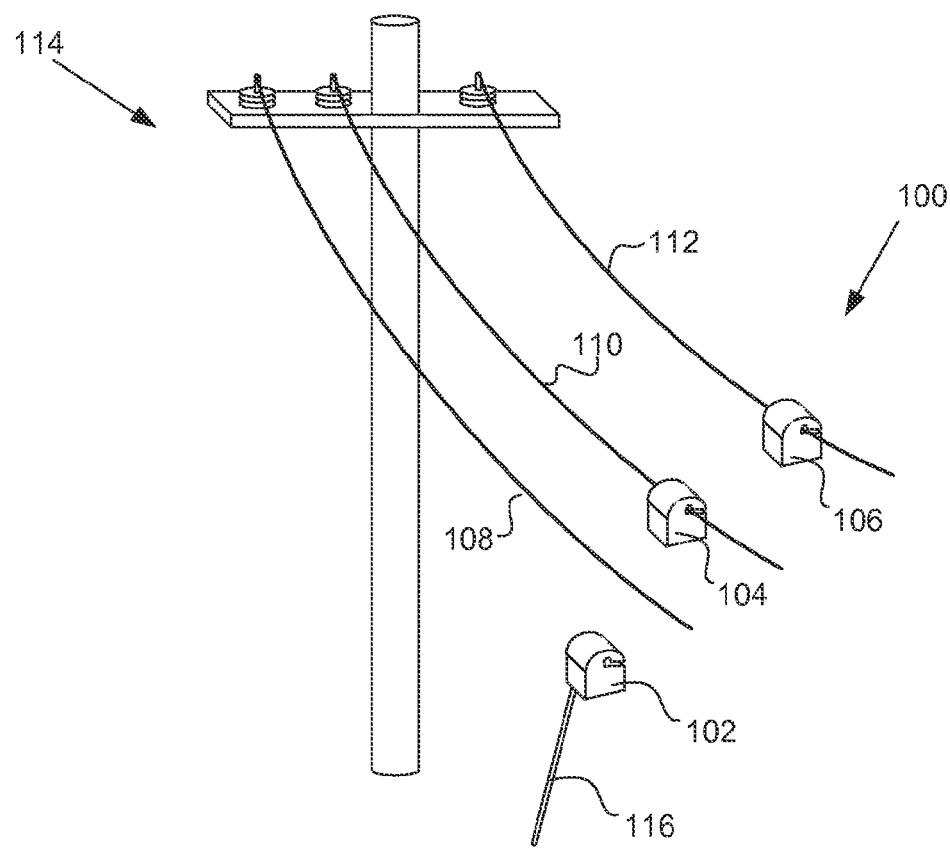
FIG. 1A illustrates one embodiment of a power line monitoring system.

Power line monitoring devices and systems described herein are configured to measure the currents and voltages of power grid distribution networks. Referring to FIG. 1A, monitoring system 100 comprises monitoring devices 102, 104, and 106 mounted to power line conductors 108, 110, and 112, respectively, of power distribution network 114. The power distribution network can be a three phase AC network, or alternatively, a single-phase network, for example. The power distribution network can be any type of network, such as a 60 Hz North American network, or alternatively, a 50 Hz network such as is found in Europe and Asia, for example. Power distribution networks, such as in the United States, typically operate at a medium voltage (e.g., 4 kV to 46 kV or higher) to reduce the energy lost during transmission over long distances. The monitoring devices can also be used on high voltage "transmission lines" or conductors that operate at voltages higher than 46 kV.

Monitoring devices 102, 104, and 106 can be mounted on each conductor of a three-phase network, as shown, and can be configured to monitor, among other things, current values and waveforms, conductor temperatures, ambient temperatures, vibration, wind speed and monitoring device system diagnostics. In some embodiments, a fourth sensor can be mounted on the ground conductor associated with the three phase lines. The monitoring devices can measure current in peak amplitude or root-mean-square (RMS) values and waveforms with, for example, with Rogowski coils, Hall-effect sensors, current transformers, or other similar current measurement devices.

In additional embodiments, multiple sensors can be used on a single phase line. The monitoring devices can be mounted quickly and easily via a hot-stick 116, and can harvest energy from the power lines for operation or be self powered (e.g., include batteries or solar panels). The monitoring devices can further include wireless transmission and receiving capabilities for communication with a central server and for communications between each monitoring device. Installation of a three monitoring device array can be placed and configured by a single linesman with a hot-stick and a bucket truck in less than 20 minutes. Monitoring device communication with the installation crew can be enabled during the installation process to provide immediate verification of successful installation.

Figure 1B:
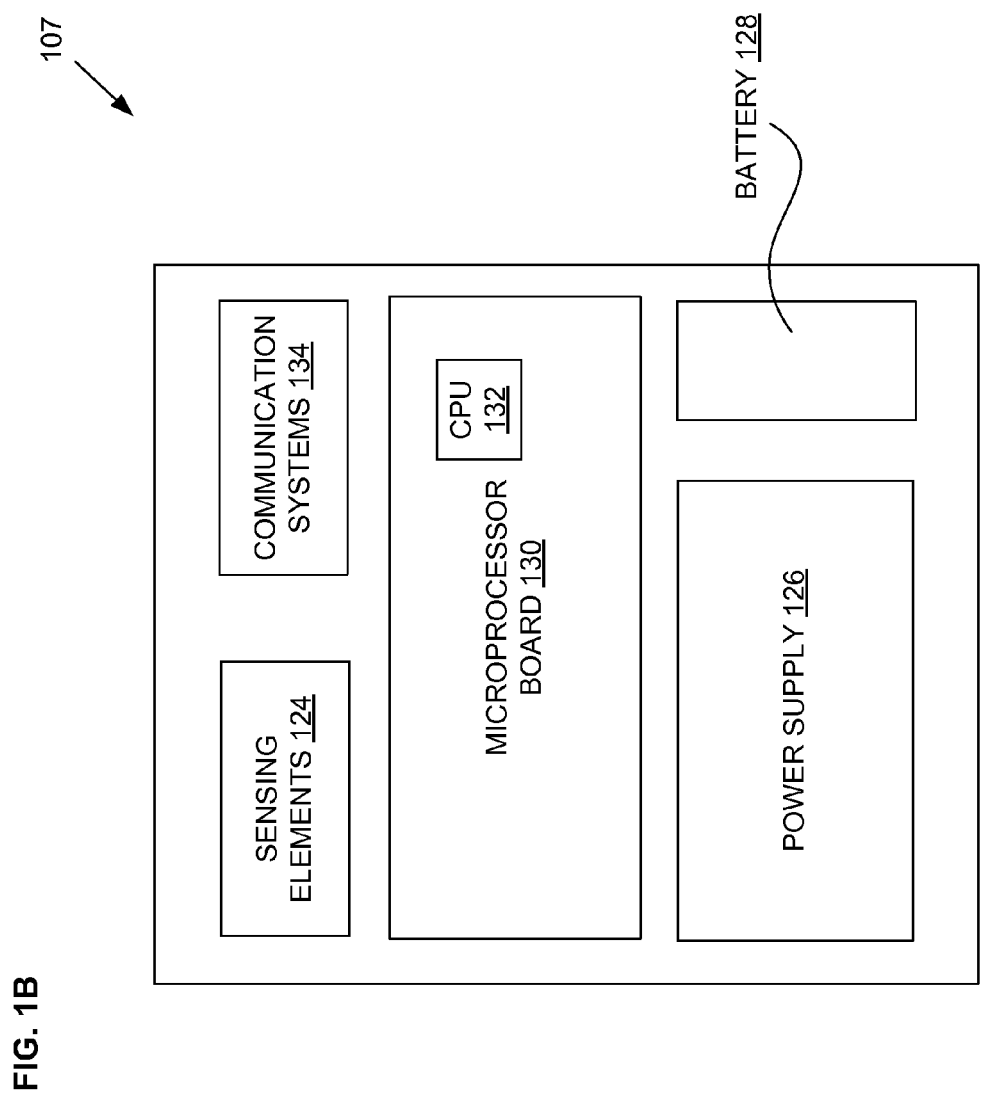
FIG. 1B illustrates one embodiment of electrical components disposed in a power line monitoring device.

FIG. 1B is a schematic drawing of the electronics 107 utilized in one embodiment of a monitoring device, which can be the same monitoring devices 102, 104, and 106, described in FIG. 1A. In some embodiments, the electronics 107 of the monitoring device can include sensors and hardware configured to measure current on the conductors and the electric field surrounding the conductors, can record and analyze power factor signatures, fault event signatures, and classify event waveforms. Current and electric field waveform signatures can be monitored and catalogued by the monitoring devices to build a comprehensive database of events, causes, and remedial actions. In some embodiments, an application executed on a central server can provide waveform and event signature cataloguing and profiling for access by the monitoring devices and by utility companies. This system can provide fault localization information with remedial action recommendations to utility companies, pre-emptive equipment failure alerts, and assist in power quality management of the distribution grid.

The electronics 107 of monitoring devices 102, 104, and 106 can comprise sensing elements 124, a power supply 126, a battery 128, a microprocessor board 130 and CPU 132, and high powered communication systems 134, including transmit and receive capabilities, disposed within a robust mechanical housing (as shown in FIG. 1A) designed for severe service conditions. The monitoring devices can be configured to withstand temperatures ranging from −40 to +85 C, EMI and ESD immunity, current and voltage impulse resistance, and driving rain and salt fog survival. The monitoring devices can also be configured to operate at up to 1000 A operating current, monitor fault currents up to 10 kA, with full functionality with a lifespan of at least 10 years in the field.

The monitoring devices can be configured to communicate through a distribution network, such as through the Silver Spring Network or any similar radio network technology, to transmit measured data such as current, electric field, fault signatures, and event waveforms. When mounted to typical power grid distribution networks, the monitoring devices can be mounted at approximately 30 feet above ground level and typically above tree tops, providing for a very substantial effective range of communication. In addition to two-way network communications for data packets and setting operational setpoints, the monitoring devices can be configured for wireless device firmware upgrades for long term functionality.

As described above, monitoring devices 102, 104, and 106 are configured to gain the performance and information-rich benefits equivalent to having direct voltage data by measuring the electric field surrounding a power grid distribution network instead. For electric field sensing the sensing elements 124 can comprise any type of electrometer, such as a "field chopping" transducer, capacitive sensing plate with charge amplifier (CCA), or piezoelectric crystals to measure electric field.

The time-varying electric field signal can enable rudimentary assessment of power factor by discriminating voltage waveform zero-crossings with respect to ambient and other phase conductors. Converting electric field measurements to voltage using capacitive sensing plates requires accurate knowledge of the interpolate dielectrics, plate geometries, and relationships to local conductive objects. To overcome the limitations of a typical capacitive plate measurement system the monitoring devices can be configured to self calibrate to determine and adjust for any disruptions in the surrounding electric field. These disruptions can include, but are not limited to, inter-conductor permittivity changes (e.g., rain, humidity, snow, pollution, etc), sensor structure surface permittivity changes (e.g., corrosion, surfactants, absorbed particulates), and changes to the area surrounding power conductors (e.g., traffic, new construction, objects or equipment placed near the lines, etc).

Figure 2A:
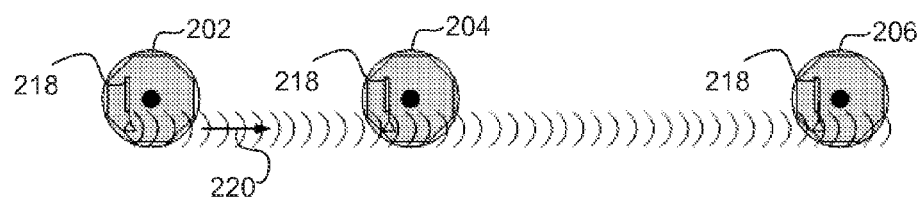
FIGS. 2A-2B illustrate one embodiment of a power line monitoring system with electric-field calibration.
Figure 2B:
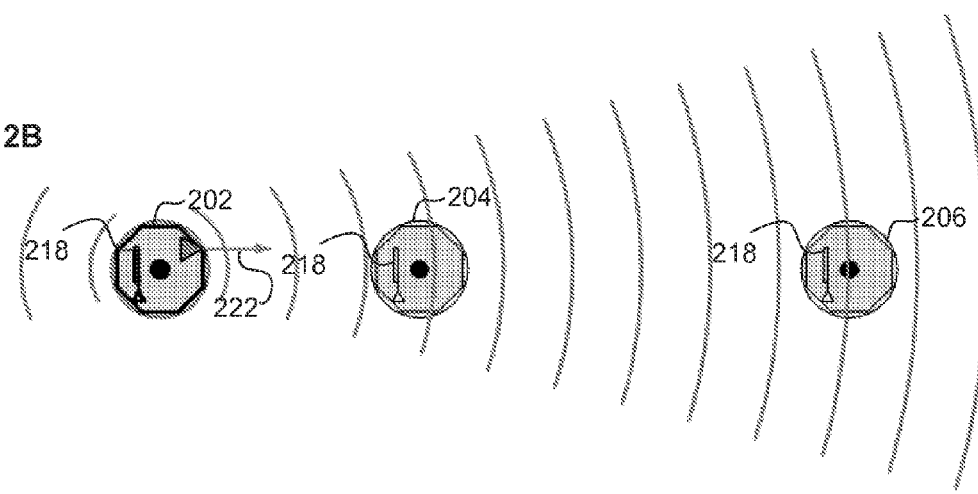

Referring now to FIGS. 2A-2B, a method of calibrating monitoring devices 202, 204, and 206 to accurately measure time-varying electric field will now be discussed. It should be understood that the calibration principles described in reference to FIGS. 2A-2B can be applied to any number of monitoring devices (e.g., more or less than three). In one embodiment, each of the monitoring devices can include an exterior mounted sensing structure 218 that forms capacitance to the adjacent monitoring devices, conductors (e.g., power lines), poles, equipment, ground objects, and the ambient environment. A general construction is to have the sensing element (e.g., sensing elements 124 from FIG. 1B) made of conductive material (metal, metalized plastics, conductive polymer plastics, etc). The sensing structures can be located on the exterior of the monitoring device or within the monitoring device behind a non-conductive enclosure. Sensing structures with a surface area of two square inches or more are desirable for obtaining sufficient signal coupling to the electric fields of the opposing power conductors and opposing monitoring devices. The time-varying electric field produced by the three-phase conductors (e.g., power lines) can be sensed as charge induced on each the sense structures 218 of the three monitoring devices 202, 204, and 206.

In one embodiment, measurement of the electric-field utilizes the communication systems of the monitoring devices to coordinate a calibration synchronization process. Referring to FIGS. 2A-2B, each of the monitoring devices is configured to communicate with the other monitoring devices to set up timing for a coordinated synchronization pulse. In one embodiment, the electric-field sense structure 218 of one or more of the monitoring devices are configured to transmit a unique time varying electric field signal to be received by the other monitoring devices. The communication path between the monitoring devices passes through the same structures, dielectrics, and space (e.g., through inclement weather such as rain or snow, or through other objects or structures that might interfere with the electric field) used for measuring the electric-fields of the conductors.

Referring to FIG. 2A, monitoring device 202 can be configured to send a timing pulse 220 to monitoring devices 204 and 206. Monitoring devices 204 and 206 can receive the timing pulse, such as with sense structure 218 or with an additional wireless receiver (not shown) to coordinate a time to calibrate the monitoring devices. Since the monitoring devices are typically continuously sampling and measuring the various parameters of the power network (e.g., current, electric field, etc), the timing pulse tells the other monitoring devices to enter a calibration mode at the specified time. The timing pulse can comprise a radio signal pulse, an electromagnetic pulse, a light pulse, or any other type of communication pulse. The pulse can either be a communication signal to start a calibration mode, or alternatively, can communicate that sometime in the future (e.g., within a few seconds or minutes) a pulse will occur and to enter a calibration mode at that time.

Referring to FIG. 2B, either immediately after receiving the timing pulse, or at a preset or predetermined time after receiving the timing pulse, monitoring device 202 can transmit a calibration pulse 222 (e.g., a unique electric field signal) to monitoring devices 204 and 206. The calibration pulse 222 can be, for example, an electromagnetic pulse having a different frequency and/or amplitude than what is found around power lines, allowing the monitoring devices to distinguish between the calibration pulse and the electric field surrounding the lines. Because of the timing pulse, monitoring devices 204 and 206 can be configured to enter a calibration mode when the calibration pulse is sent by monitoring device 202. The signal received by monitoring devices 204 and 206 from monitoring device 202 allows each monitoring device to mathematically compensate for parametric shifts incurred by environmental changes and aging of the monitoring devices. Since the calibration pulse must travel through the same space as the electric field of the power lines, any degradation in the signal quality of the electric field will be replicated by a similar or identical degradation in the signal quality of the calibration pulse.

The calibration pulse can be transmitted with known properties, such as having a certain transmission frequency, amplitude or phase in signal level (or is communicated what the amplitude will be). The received signal amplitude forms a sensed difference; amplitude and/or frequency expected minus amplitude and/or frequency actually received. Thus, the sensed difference in the calibration pulse from the known expected pulse level and the value received (e.g., the sensed difference in the pulse sent by monitoring device 202 and received by monitoring devices 204 and 206) indicates the changes that occur in the medium or space separating each of the monitoring devices. Therefore, the monitoring devices can be calibrated to account for the difference between a measured electric-field and the actual electric-field based on the difference in the transmitted and received calibration pulse.

The time-varying electric field generated by one monitoring device for the calibration pulse can be in the same frequency range as the frequency of the power conductor, for example 30 hz to 540 hz in 50 hz or 60 hz systems. As is known to those in the industry the spectral content of the electric field is the primary frequency (60 hz for example) and odd harmonics up through $9^{th}$ having significant energy content. In a steady-state condition the spectral energy in the electric field is confined to the primary and odd harmonics leaving open spectral space between. Situating the calibration pulse time varying frequency between the primary and harmonics facilitates the separation of the received calibration pulse amplitude from the on-going power distribution power signal. Digital signal processing techniques can be used for extracting spectral component amplitudes and filtering for discrimination and detection of the calibration signal or the power grid signal. A calibration pulse with fixed amplitude of 1 kV, 200 Hz frequency, and 100 ms duration is one example meeting the requirements for a signal that can be discriminated by frequency selectivity. The variation in amplitude of the calibration pulse signal received from the pre-programmed expected amplitude or previously communicated amplitude is the basis for determining the degradation of the calibration pulse (also called the error-correction signal). The error-correction signal can then be used to scale the sensitivity of the electric field sensing system to adjust for changes in dielectric properties, near-field conductive objects, and precipitation effects in or near the measurement system.

In some embodiments, each of the monitoring devices can take a turn being a transmitter or "master" source. For example, as shown in FIG. 2B, monitoring device 202 can send transmitting and calibration pulses to monitoring devices 204 and 206. Next, monitoring device 204 can send transmitting and calibration pulses to monitoring devices 202 and 206, and monitoring device 206 can send transmitting and calibration pulses to monitoring devices 202 and 204. In another embodiment, there can be a single master or transmitter source (e.g., device 202), and the remaining monitoring devices can include receive-only capabilities without the ability to transmit calibration pulses to the other devices. This alternative configuration can still allow for calibration to the unique electric field properties surrounding the lines, but allow the non-master or slave devices to be manufactured at a lower cost by not including the transmission features and structures.

The calibration process can be run on a periodic basis (e.g., once an hour, once a day, once a week, or on any schedule programmed by a user, etc), selectively as environmental conditions change, or on command from distribution management system (DMS). The DMS can compare voltage measurements against sub-station data and other field measurements and initiate a calibration sequence when comparisons deviate beyond a prescribed amount. In other embodiments.

The time varying field surrounding a power grid distribution network is complex in nature due to phased conductor voltages, voltage harmonics, conductor positions, and surrounding conductive surfaces. In some embodiments, the critical information discerned from the monitoring devices for each of the three conductors are: zero-crossing of the voltage, phase identification, relative voltage amplitudes and fault-induced voltage deviations, and absolute voltage amplitudes. Each of the three monitoring devices can detect a unique portion of the electric field from its positional standpoint. By sharing information about each of the sensed electric fields from each vantage point, a composite view of the electric field can be assessed. The composite view assessment can be performed by one of the monitoring devices as having been pre-assigned as the 'master' device, or co-processed among all three monitoring devices in a shared collaborative approach, as described above.

The current measurement signal already used in the monitoring devices can provide a 60 Hz (North America, 50 Hz Europe and Asia) primary signal for a phase-locked loop (PLL) generated signal that drives the electric-field sampling and demodulation circuits. The PLL and control loop can be realized in discrete circuit, or as a digital signal processing (DSP) function. Sampling the electric-field signal synchronously with a 60 Hz conductor current can significantly reduce artifact signals that are outside the region of interest. The general bandwidth required is 60 Hz to 540 Hz which spans the fundamental up through the $9^{th}$ harmonic (a triple harmonic). Within this band range only odd-harmonic frequencies are of interest for first-order calculations of power factor and phase. These can be obtained thru selective comb filtering in the DSP. Very low frequency (VLF) artifacts, including weather and environmental changes, passing vehicles, smoke, ozone, and triboelectric effects from wind and rain, can be readily rejected by the synchronous demodulator.

In-band 'noise' signals include adjacent transmission and distribution lines and switch-mode power supplies. Noise in the high frequencies above the range of interest include lighting ballasts, switch-mode power supplies, and rf transmitters which are generally easy to mitigate by attenuation at the analog front-end.

The monitoring systems described herein provide power line monitoring devices configured to self calibrate to accurately measure electric-fields of power grid distribution networks, and thus to accurately infer voltage on the power lines at any desired deployment position along the lines. Being able to accurately measure voltage downstream on the power lines allows utility companies to accurately gauge power factor at any desired location in a power network, instead of being limited to measuring power factor only at an electrical sub-station.

Figure 3:
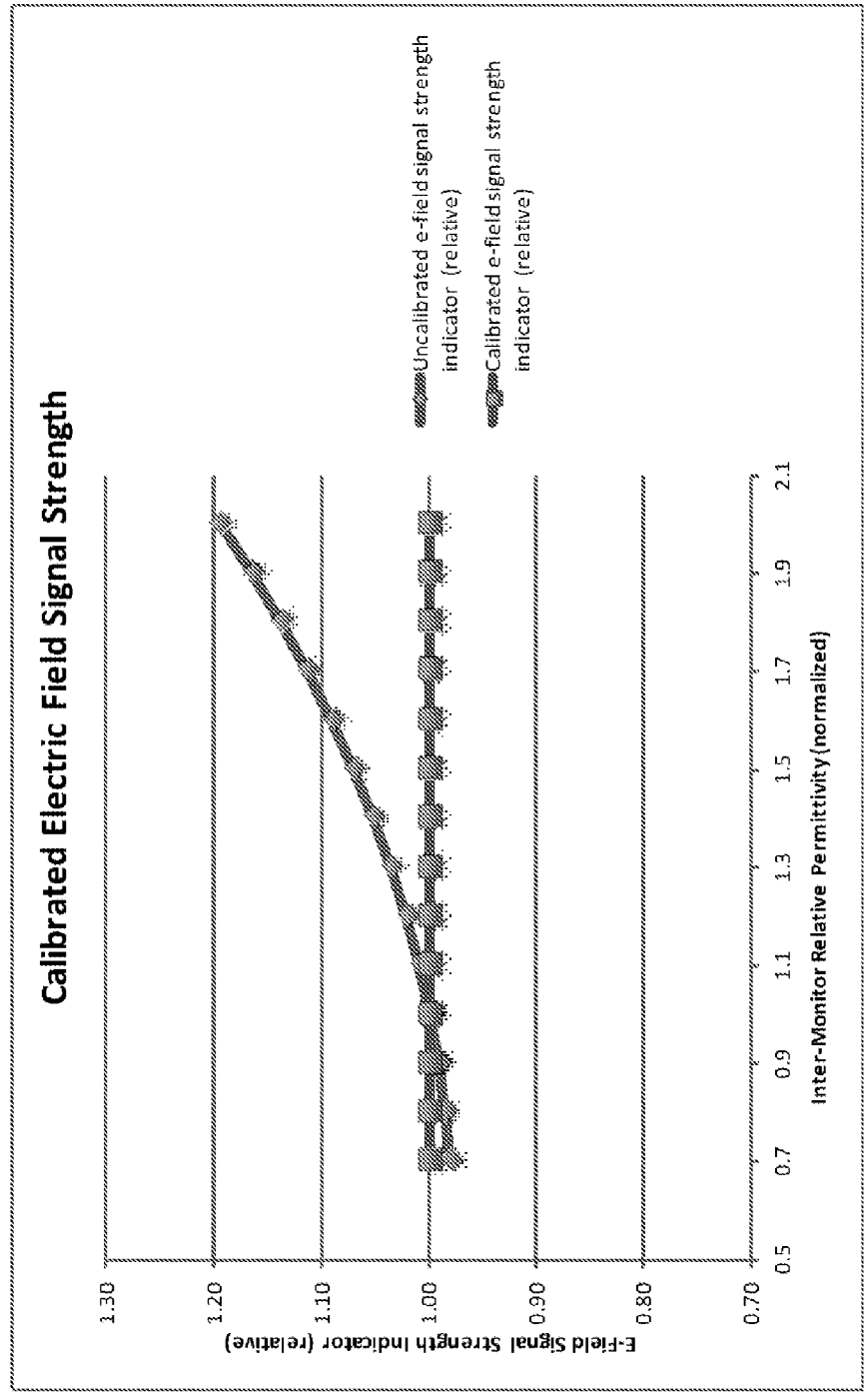
FIG. 3 is a chart illustrating an uncalibrated electric field and a corresponding calibrated electric field.

FIG. 3 and Table 100 show a measured electric field and a calibrated electric field according to the embodiments described above. As shown in FIG. 3, an un-calibrated electric field signal strength indicator can have a non-linear shape, due to changes in relative permittivity between adjacent monitoring devices. The calibrated representation of the electric field is shown as the flat line. This calibrated representation is achieved by determining the changes in permittivity between the adjacent monitoring devices (as described in the calibration process above) and adjusting the measuring electric field based on the calibration process.

TABLE 100

| Interstitial relative permittivity (normalized) | Uncalibrated e-field signal strength indicator (relative) | Calibrated e-field signal strength indicator (relative) |
| --- | --- | --- |
| 0.7 | 0.98 | 1 |
| 0.8 | 0.98 | 1 |
| 0.9 | 0.99 | 1 |
| 1 | 1.00 | 1 |
| 1.1 | 1.01 | 1 |
| 1.2 | 1.02 | 1 |
| 1.3 | 1.04 | 1 |
| 1.4 | 1.05 | 1 |
| 1.5 | 1.07 | 1 |
| 1.6 | 1.09 | 1 |
| 1.7 | 1.11 | 1 |
| 1.8 | 1.14 | 1 |
| 1.9 | 1.16 | 1 |
| 2 | 1.19 | 1 |

As for additional details pertinent to the present invention, materials and manufacturing techniques may be employed as within the level of those with skill in the relevant art. The same may hold true with respect to method-based aspects of the invention in terms of additional acts commonly or logically employed. Also, it is contemplated that any optional feature of the inventive variations described may be set forth and claimed independently, or in combination with any one or more of the features described herein. Likewise, reference to a singular item, includes the possibility that there are plural of the same items present. More specifically, as used herein and in the appended claims, the singular forms "a," "and," "said," and "the" include plural referents unless the context clearly dictates otherwise. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation. Unless defined otherwise herein, all technical and scientific terms used herein have the same meaning as commonly understood by one of ordinary skill in the art to which this invention belongs. The breadth of the present invention is not to be limited by the subject specification, but rather only by the plain meaning of the claim terms employed.

What is claimed is:

1. A method of monitoring a power grid distribution network, comprising:
   transmitting a calibration pulse with a first monitoring device on a first power conductor;
   receiving the calibration pulse with a second monitoring device on a second power conductor;
   determining a degradation of the calibration pulse from the first monitoring device to the second monitoring device; and
   calibrating the second monitoring device to account for a difference between a measured electric-field of the second power conductor and an actual electric-field of the second power conductor based on the degradation of the calibration pulse.

2. The method of claim 1 further comprising receiving the calibration pulse with a third monitoring device on a third power conductor.

3. The method of claim 1 wherein the power grid distribution network comprises a three-phase network.

4. The method of claim 2 wherein the first, second, and third monitoring devices are disposed on power conductors corresponding to each phase of a three-phase network.

5. The method of claim 1, the calibration pulse comprising a time varying electromagnetic pulse.

6. The method of claim 5 wherein the electromagnetic pulse comprises properties different than the electric field properties surrounding the power grid distribution network.

7. The method of claim 5 wherein the electromagnetic pulse comprises a time varying frequency between the primary and harmonics frequencies of the power grid distribution network.

8. The method of claim 1 further comprising, prior to the transmitting a calibration pulse step, transmitting a timing pulse from the first monitoring device to the second monitoring device to coordinate a calibration of the devices.

9. The method of claim 8 wherein the second monitoring device enters a calibration mode after receiving the timing pulse.

10. The method of claim 8 wherein the second monitoring device enters a calibration mode a pre-determined period of time after receiving the timing pulse.

11. The method of claim 1 wherein the degradation comprises a sensed difference in the calibration pulse transmitted by the first monitoring device and received by the second monitoring device.

12. A power distribution network monitoring system, comprising:
    a first monitoring device disposed on a first power conductor and comprising sensors configured to measure an electric-field of the first power conductor, the first monitoring device including a transmitter configured to transmit a calibration pulse;
    a second monitoring device disposed on a second power conductor in the vicinity of the first monitoring device and comprising sensors configured to measure an electric-field of the second power conductor, the second monitoring device including a receiver configured to receive the calibration pulse from the first monitoring device; and
    a processor disposed in the second monitoring device, the processor configured to determine a degradation of the calibration pulse after it has been received by the second monitoring device, the processor further configured to calibrate a measured electric-field surrounding the second power conductor based on the degradation of the calibration pulse.

13. The power distribution network monitoring system of claim 12 further comprising a third monitoring device disposed on a third power conductor in the vicinity of the first and second monitoring devices and configured to measure an electric-field of the third power conductor, the third monitoring device including a receiver configured to receive the calibration pulse from the first monitoring device.

14. The power distribution network monitoring system of claim 13 wherein the first, second, and third power conductors comprise a three-phase power network.

15. The power distribution network monitoring system of claim 12 wherein the first and second power conductors comprise a single-phase power network.

16. The power distribution network monitoring system of claim 12, the first and second monitoring devices being configured to harvest energy from the power conductors for operation.

17. The power distribution network monitoring system of claim 12, the first and second monitoring devices being configured to monitor the power conductors for events or faults.

18. The power distribution network monitoring system of claim 12 wherein the calibration pulse comprises a time varying electromagnetic pulse.

19. The power distribution network monitoring system of claim 18 wherein the electromagnetic pulse comprises properties different than the electric field properties surrounding the power grid distribution network.

20. The power distribution network monitoring system of claim 18 wherein the electromagnetic pulse comprises a time varying frequency between the primary and harmonics frequencies of the power grid distribution network.

* * * * *